(12) United States Patent
Arai et al.

(10) Patent No.: US 6,809,583 B2
(45) Date of Patent: Oct. 26, 2004

(54) ELECTRONIC DEVICE FOR SUPPLYING DC POWER AND HAVING NOISE FILTER MOUNTED WITH EXCELLENT NOISE REDUCTION

(75) Inventors: Satoshi Arai, Sendai (JP); Kazumasa Ohya, Sendai (JP); Takayuki Inoi, Sendai (JP); Yoshihiko Saiki, Sendai (JP)

(73) Assignee: NEC Tokin Corporation (JP)

( * ) Notice: Subject to any disclaimer, the term of this patent is extended or adjusted under 35 U.S.C. 154(b) by 0 days.

(21) Appl. No.: 10/391,864

(22) Filed: Mar. 19, 2003

(65) Prior Publication Data

US 2004/0008531 A1 Jan. 15, 2004

(30) Foreign Application Priority Data

Mar. 19, 2002 (JP) ........................................ 2002-076318

(51) Int. Cl.[7] .............................................. H01L 25/00
(52) U.S. Cl. ........................................ 327/565; 327/551
(58) Field of Search ................................. 327/551, 552, 327/558, 559, 564, 565, 566

(56) References Cited

U.S. PATENT DOCUMENTS 5,717,359 A * 2/1998 Matsui et al. ............... 327/565
6,157,250 A * 12/2000 Camerlo ...................... 327/565

FOREIGN PATENT DOCUMENTS

| JP | 2000-077852 | 3/2000 | ............ H05K/3/46 |
| JP | 2002/164760 | 6/2002 | ............ H03H/7/01 |

* cited by examiner

Primary Examiner—Jeffrey Zweizig
(74) Attorney, Agent, or Firm—Hayes Soloway P.C.

(57) ABSTRACT

In an electronic device supplying a DC power to an LSI chip (20), a noise filter (1) of a distributed constant type, having an input port (2, 3) and an output port (5, 4), is mounted on a circuit board (6). The noise filter (1) reduces high-frequency noise incoming thereto and allows DC current to flow therethrough. The input port (2, 3) is connected to a DC power line (7a) and a ground conductor (8a) on the circuit board (6). The output port (5, 4) is connected to a separate power conductor (7b) and a separate ground conductor (8b) which are connected to the LSI (20) mounted on the circuit board (6). In another embodiment, the LSI (20) is mounted on a different circuit board (17) to which the output port (5, 4) is connected through conductor pins (18, 19) standing on the circuit board (6).

14 Claims, 17 Drawing Sheets

ELECTRONIC DEVICE FOR SUPPLYING DC POWER AND HAVING NOISE FILTER MOUNTED WITH EXCELLENT NOISE REDUCTION

This application claims priority under to prior application JP 2002-76318, the disclosure of which is incorporated herein by reference.

BACKGROUND OF THE INVENTION

The present invention relates to an electronic device for supplying a DC power from a DC power source to a load circuit and, in particular, to such a DC power supplying electronic device having a noise filter mounted on a circuit board.

Recently, a digital circuit technology including an LSI (Large Scale Integrated circuit) has widely been used in various applications such as computers, communication apparatuses, household appliances, car-used apparatuses, and so on. In those applications, there is an electromagnetic interference (EMI) problem that the digital circuit used generates a high frequency noise current, which flows through a power line to a power source. The power line may radiate an undesired electromagnetic wave as a noise. And the noise current may also flow into other circuits connected to the power source.

In order to settle the EMI problem, it is effective to the, so called, power decoupling technique, where the noise current from the digital circuit such as an LSI chip is eliminated, attenuated or reduced. In other words, the power source and the power line are isolated from the LSI chip in the high frequency. In the power decoupling technique, a noise filter is used as an existing decoupling chip, which comprises a capacitor of a various type. This is shown in, for example, FIG. 5 of JP-A 2000-77852.

Referring to FIG. 1, a capacitor 25 as the noise filter is connected between a ground conductor layer (GND layer) 8 and a power line conductor layer (VCC layer) 7 in a circuit board 6, on which an LSI chip 20 is mounted and is connected to the VCC layer 7 and the GND layer 8. The VCC layer 7 and the GND layer 8 are connected to a DC power line (not shown) and the LSI chip 20 are therefore supplied with a DC power from the DC power source through the VCC layer 7 and the GND layer 8. In the circuit structure, the VCC and GND layers 7 and 8 are short-circuited in the high frequency by the capacitor 25. The high frequency noise current flows from LSI chip 20 through a loop shown by an arrow of a solid line and is eliminated from the power line circuit comprising the VCC layer 7 and GND layer 8. However, it is difficult for the capacitor 25 to retain a low impedance to an extent of a higher frequency. This is because of a self-resonance phenomenon of the capacitor. Therefore, when the frequency of the noise current becomes higher and higher, the impedance of the capacitor 25 becomes higher so that the noise current does not flow through the capacitor 25 but flows through the VCC layer 7 and the GND layer 8 extending over the entire region of the circuit board 6, as shown by another arrow of dotted line, and therefore to the power source (not shown). Thus, undesired electromagnetic wave is radiated, unfortunately. Therefore, the existing noise filter such as capacitor is not effective for the power decoupling to attenuate the noise current in a recent tendency where a signal transmission speed is increased more and more in the digital circuit.

Therefore, in use of the digital circuit operated at an increased high speed, a noise filter is required, which has a low impedance even at an elevated high frequency. Such a noise filter as required is proposed by two of the present joint inventors together with a different joint inventor in a prior Japanese Patent Application No. 2001-259453 filed on Aug. 29, 2001 (published under No. JP-A 2002-164760 on Jun. 7, 2002), which is assigned to the same assignee of the present application. The noise filter proposed in the prior patent application is a capacitor in the structure but is a noise filter of a distributed-constant circuit type at a high frequency. Therefore, the proposed noise filter can be used in the manner similar to the capacitor 25 in FIG. 1.

Referring to FIG. 2, it will be described as to an example using the proposed noise filter 1 of the distributed constant circuit type in place of the existing noise filter 25 comprising a capacitor on a circuit board similar to the circuit board 6 shown in FIG. 1. The noise filter 1 and a load circuit 20 are mounted on the circuit board 6. The noise filter 1 is provided with power input, ground input, power output, and ground output terminals 2, 3, 5, and 4.

The circuit board 6 is different from the circuit board of FIG. 1 and have first to fourth conductor lands 13, 14, 15, and 16 to which the power input terminal 2, ground input terminal 3, ground output terminal 4, and power output terminal 5 are connected, respectively. First and fourth conductor lands 13 and 16 are connected to VCC layer 7 through through-holes 9 and 12, respectively. Second and third conductor lands 14 and 15 are connected to the GND layer 8 through through-holes 10 and 11, respectively.

In the structure shown in FIG. 2 using the proposed noise filter 1, there is still a problem that it is insufficient in reduction of the high frequency noise, because of the reasons described below.

In the circuit board 6, VCC layer 7 and the GND layer 8 are usually formed with wide and continuous patterns, respectively. Therefore, the impedances of the VCC layer 7 and the GND layer 8 are generally very low. Contrastively, the impedances of the through-holes 9–12 connecting VCC layer 7 and GND layer 8 to the first to fourth conductor lands 13–16 are generally higher than those of the VCC and GND layers 7 and 8. Furthermore, the impedances of the through-holes 9–12 tend to become higher according to elevation of a frequency of the noise current.

Therefore, as the frequency of the noise current becomes higher and higher, the noise current is difficult to flow into the noise filter 1 through through-holes 9–12. Thus, the noise current is not reduced but transmitted through the VCC layer 7 and GND layer 8.

SUMMARY OF THE INVENTION

In view of the above-mentioned circumstances, an object of the present invention is therefore to provide an electronic device for supplying a DC power from a DC power source to a load circuit, which can sufficiently reduce a high frequency noise generated from the load circuit.

The present invention provides an electronic device for supplying a DC power to a load circuit from a power source and isolating in high frequency a power line circuit including the power source from the load circuit generating a high frequency noise. The electronic device comprises a circuit board and a noise filter. The circuit board comprises first through fourth conductor lands formed on a surface of the circuit board, a power line conductor layer connected to the first conductor land, and a ground conductor layer connected to the second conductor land. The power line conductor layer is adapted to be connected to the power source. The ground conductor layer is adapted to be grounded. The noise filter is mounted on the circuit board and has a power input terminal, a ground input terminal, a ground output terminal, and a power output terminal, which are connected to the first through the fourth conductor lands, respectively. The noise filter has a high frequency filtering circuit for reducing the high frequency noise incoming thereto but allowing a DC current to pass therethrough. The device further comprises power and ground conductors. The power and the ground conductors are connected to the fourth and the third conductor lands for connecting the third and the fourth conductor lands with the load circuit without connecting to the power line conductor layer and the ground conductor layer.

The ground input terminal and the ground output terminal may be joined to each other to form a single ground terminal.

The power line conductor layer may be formed, as an inner layer, in the circuit board and be connected to the first conductor land through a first through-hole formed in the circuit board.

The ground conductor layer may be formed, as an inner layer, in the circuit board and be connected to the second conductor land through a second through-hole formed in the circuit board.

The power line conductor layer may be formed on the surface of the circuit board and connected on the first conductor land.

The ground conductor layer may be formed on a rear surface of the circuit board and be connected to the second conductor land through a third through-hole formed in the circuit board.

The power conductor may be formed, as an inner layer, in the circuit board and be connected to the fourth conductor land through a fourth throughhole formed in the circuit board.

The ground conductor may be formed, as an inner layer, in the circuit board and be connected to the third conductor land through a fifth through-hole formed in the circuit board.

The power conductor layer may be formed on the surface of the circuit board and connected to the fourth conductor land.

The ground conductor may be formed on a rear surface of the circuit board and connected to the third conductor land through a sixth through-hole formed in the circuit board.

The load circuit may be mounted on the surface of the circuit board and is connected to the power conductor and the ground conductor.

The load circuit may be mounted on a different circuit board separate from the circuit board. The power and the ground conductors may include a power conductor pin and a ground conductor pin connected to the fourth and the third conductor lands, respectively, on the circuit board for connecting the fourth and the third conductor lands with the different circuit board to establish an electrical connection of the fourth and the third conductor lands to the load circuit.

The load circuit may be surface-mounted on the different circuit board. Furthermore, the power and the ground conductor pins may penetrate in the different circuit board from a rear surface to the surface thereof.

The noise filter may be a distributed constant type.

Still another objects, features, and advantages of the present invention will become apparent upon a reading of the following detailed description.

DESCRIPTION OF THE PREFERRED EMBODIMENTS

Figure 1:
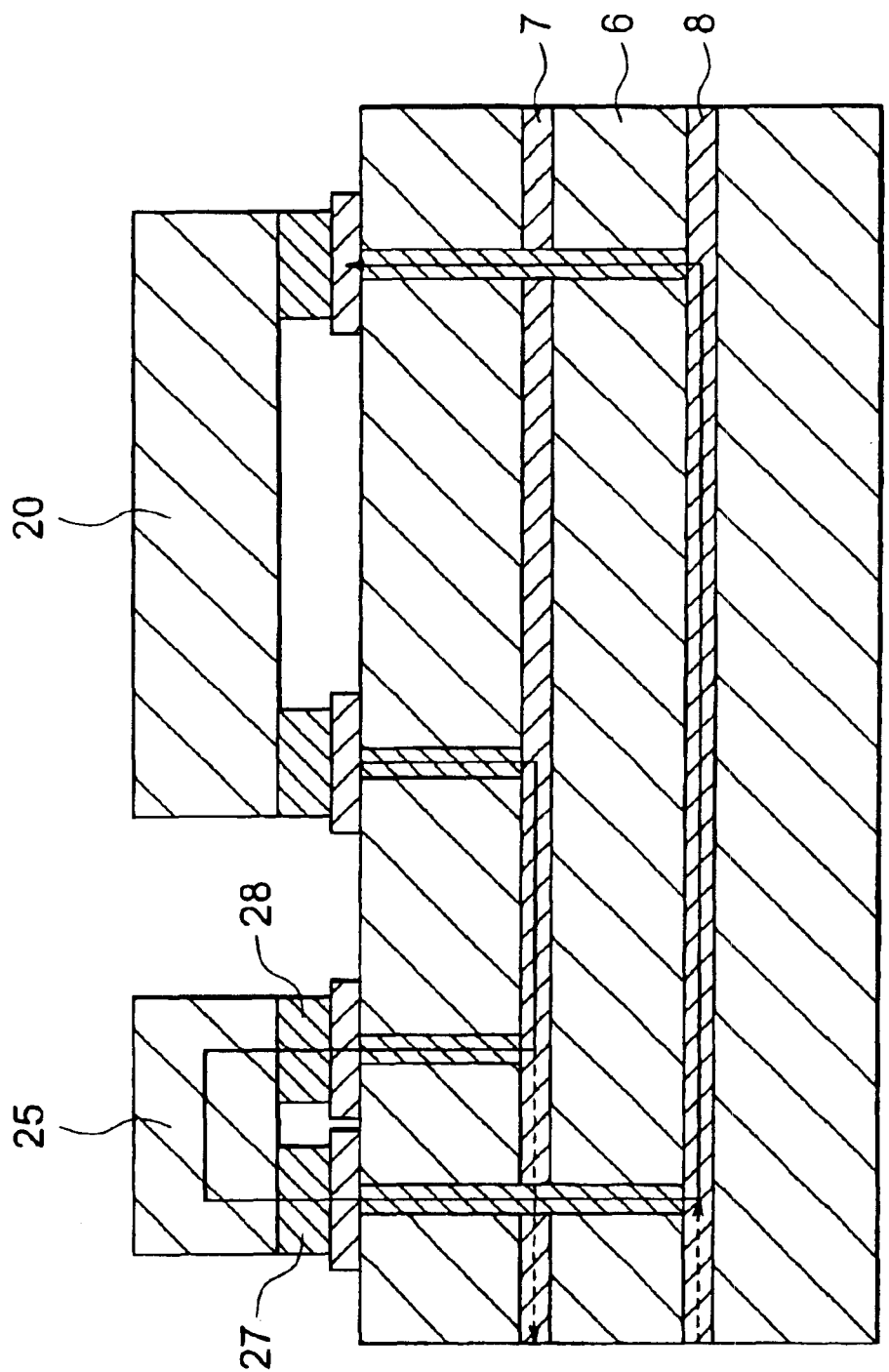
FIG. 1 is a schematic cross sectional view of an existing electronic device comprising a circuit board with a noise filter for supplying a DC power to a load circuit.
Figure 2:
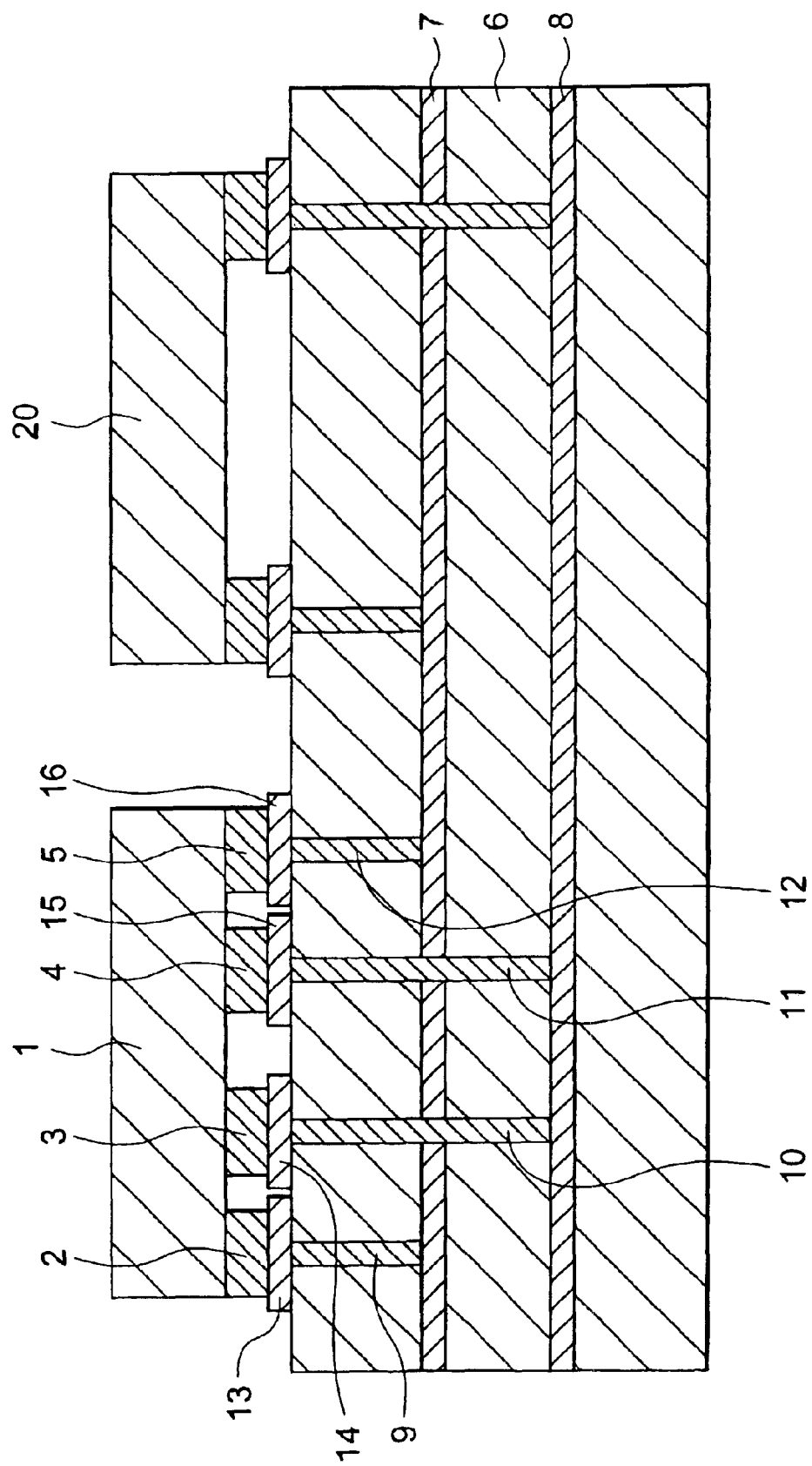
FIG. 2 is a schematic cross sectional view of a circuit board using another noise filter proposed in the prior patent application.

Now, description will be made as to various embodiments of the present invention with reference to FIGS. 3 to 14. In the figures, similar parts are represented by the same reference numerals. Further, a noise filter 1 used in those embodiment is a distributed constant type proposed in the prior patent application cited in the preamble of this description, and will be described as to its internal structure and different equivalent circuits hereinafter in connection with FIGS. 15–17.

First Embodiment

Figure 3:
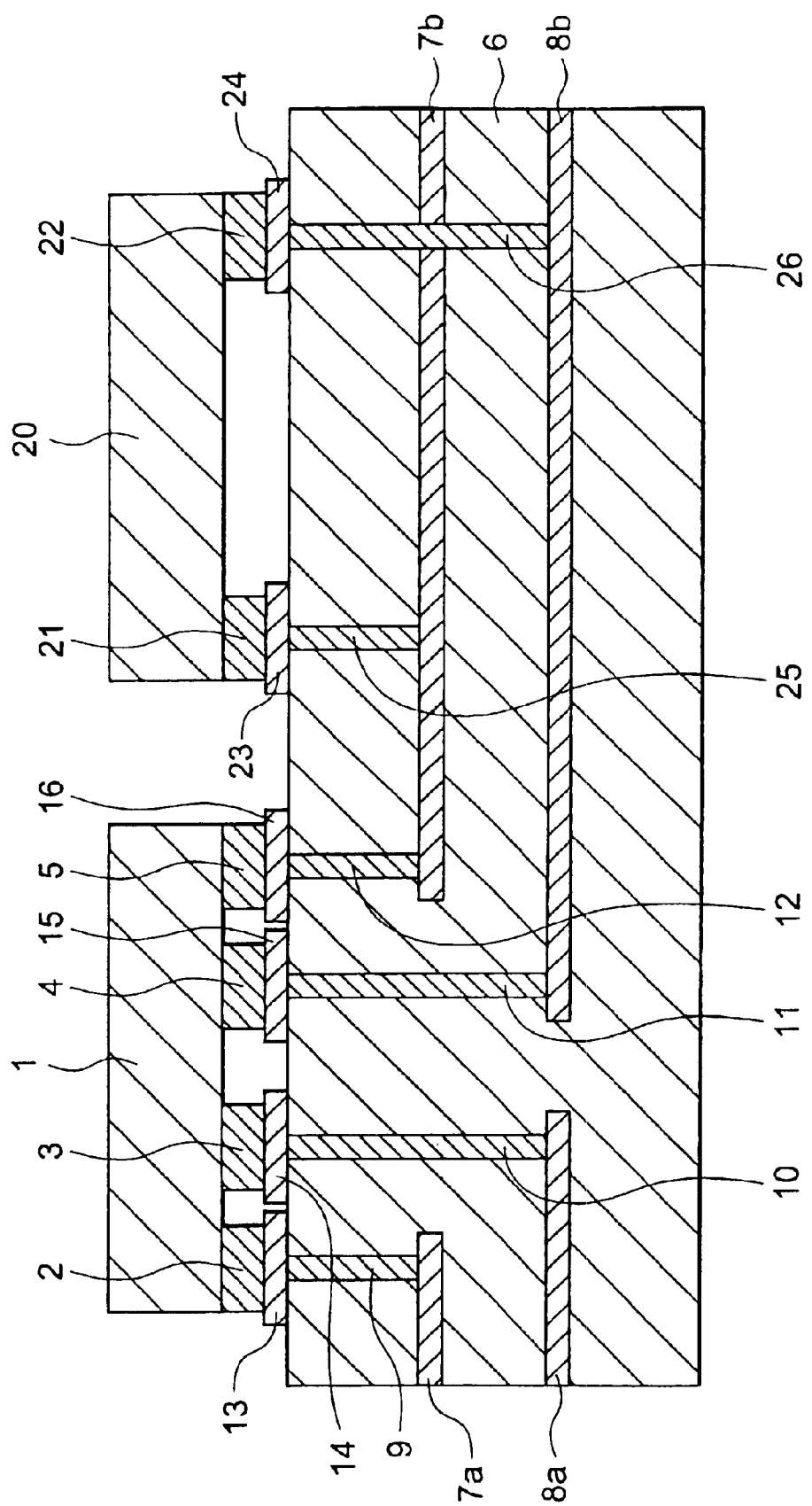
FIG. 3 is a schematic cross sectional view of an electronic device according to a first embodiment of the present invention.

Referring to FIG. 3, an electronic device comprising a circuit board 6 and the noise filter 1 mounted on the circuit board. In this embodiment, a load circuit 20 such as an LSI chip is also mounted on the same circuit board 6.

The noise filter 1 has power and ground input terminals 2 and 3 and power and ground output terminals 5 and 4.

The circuit board 6 has first to fourth conductor lands 13–16 on a surface of the circuit board 6 for connecting the power and ground input terminals 2 and 3 and the ground and power output terminals 5 and 4 of the noise filter 1, respectively. The circuit board 6 has a power line conductor layer (VCC layer) 7a and a ground layer (GND layer) 8a as separate inner conductor layers within the circuit board 6. The VCC layer 7a and GND layer 8a extend to positions just under the first and second conductor lands 13 and 14, respectively, and are connected to the first and second conductor lands 13 and 14 through first and second through-holes 9 and 10 vertically extending from the VCC layer 7a and GND layer 8a to the firs and second conductor lands 13 and 14, respectively, in the circuit board 6. The VCC layer 7a and GND layer 8a are connected to a DC power source (not shown). Therefore, the noise filter 1 is connected to the DC power source at power and ground input terminals 2 and 3 through a potential loop (7a–9–13) and a ground loop (8a–10–3), respectively.

The circuit board 6 is further provided with a power conductor or output power conductor (O-VCC layer) 7b and an output ground conductor (O-GND layer) 8b as inner conductor layers formed separate from the VCC layer 7a and GND layer 8a in the circuit board. The O-VCC layer 7b and O-GND layer 8b extend positions just under the fourth and third conductor lands 16 and 15, respectively. The third and fourth conductor lands 15 and 16 are connected the O-GND layer 8b and the O-VCC layer 7b through third and fourth through-holes 11 and 12 formed in the circuit board 6.

Accordingly, the DC power applied from the DC power source to the noise filter 1 at the power and ground input terminals 2 and 3 is present on the power and ground output terminals 5 and 4 as described hereinafter, and is supplied to the O-VCC and O-GND layers 7b and 8b through fourth and third conductor lands 16 and 15 and fourth and third through-holes 12 and 11.

In this embodiment, the LSI chip 20 is surface-mounted on the surface of the circuit board 6.

The LSI chip 20 is provided with a power and ground terminals 21 and 22.

The circuit board 6 is provided with fifth and sixth conductor lands 23 and 24 on the surface thereof, which are connected to the power and ground terminals of LSI chip 20. The fifth and sixth conductor lands 23 and 24 are connected to O-VCC layer 7b and O-GND layer 8b through the fifth and sixth through-holes 25 and 26. Accordingly, the DC power on O-VCC layer 7b and O-GND layer 8b is supplied to the LSI chip 20.

If a noise current of a high frequency is generated at LSI chip 20 operating and flows through O-VCC and O-GND layers 7b and 8b, the noise current reliably flows into the noise filter 1 at power and ground output terminals 5 and 4, because the O-VCC and O-GND layers are only connected to the terminals 5 and 4 through the through-holes 12 and 11 without connecting to the VCC and GND layers 7a and 8b. Thus, the noise current is reduced or attenuated at the noise filter 1.

Second Embodiment

Figure 4:
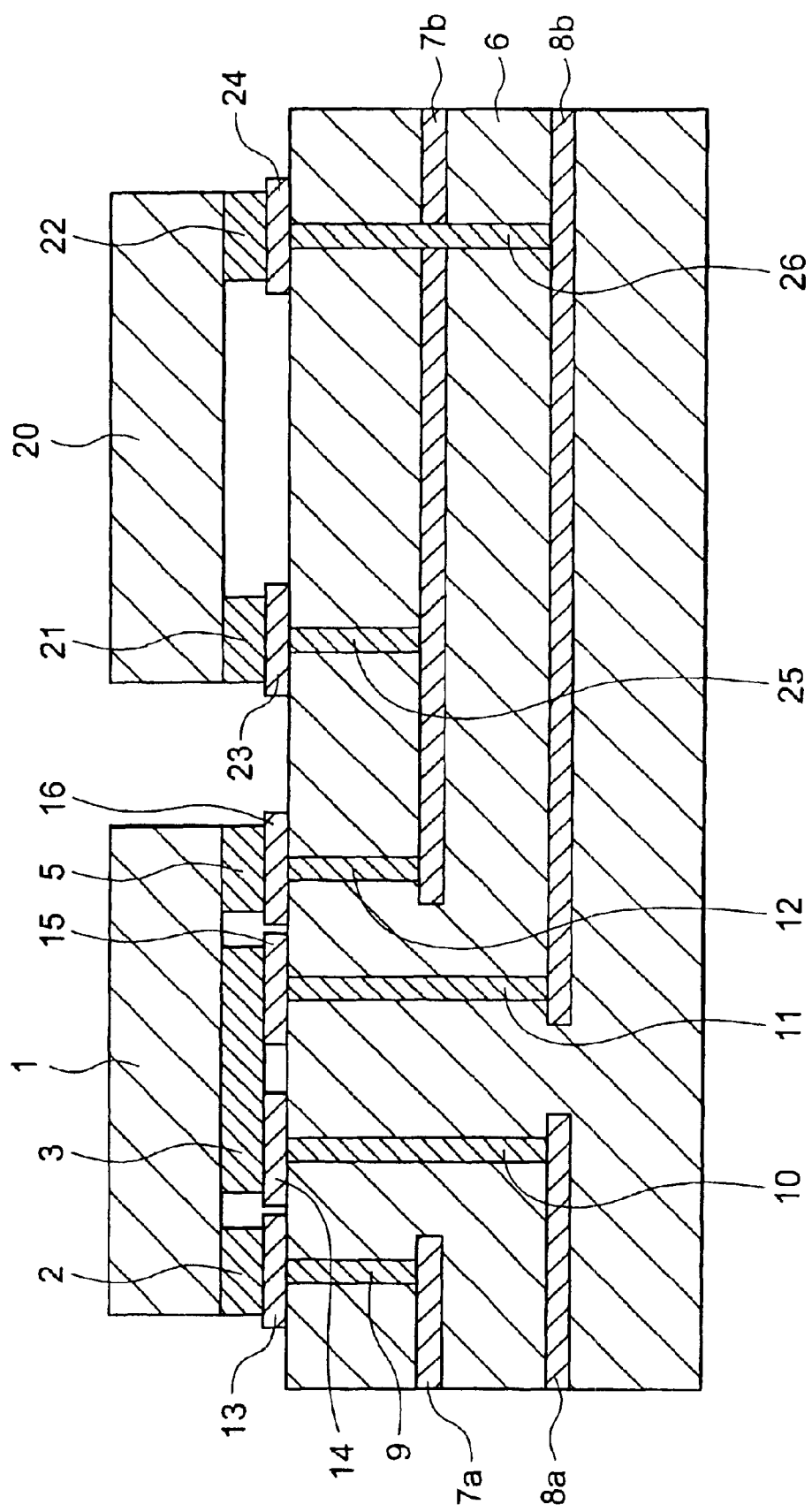
FIG. 4 is a schematic cross sectional view of an electronic device according to a second embodiment of the present invention.

Referring to FIG. 4, the electronic device shown therein is similar to that of the first embodiment except that the ground input and output terminals 3 and 4 in FIG. 3 are joined to form a single ground terminal denoted by reference numeral 3, alone.

In this embodiment, those skilled in the art can understand that the electronic device shown in FIG. 4 according to this embodiment operates in the similar manner to the embodiment shown in FIG. 3.

Third Embodiment

Figure 5:
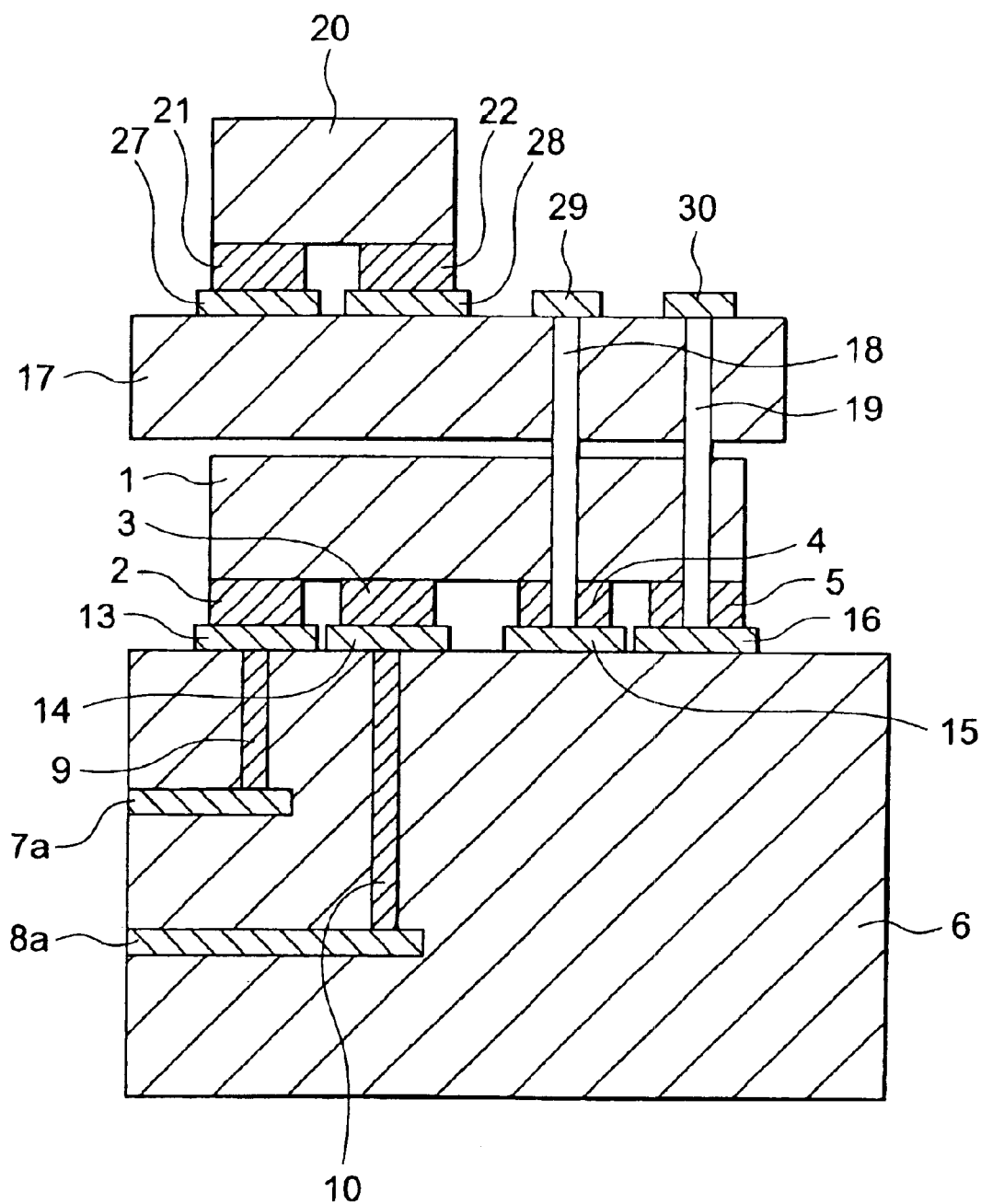
FIG. 5 is a schematic cross sectional view of an electronic device according to a third embodiment of the present invention.

Referring to FIG. 5, the electronic device shown therein according to the third embodiment is one for supplying a DC power to a LSI chip 20 mounted on a different circuit board 17. The different circuit board 17 has conductor lands 27 and 28 receiving the power and ground terminals 21 and 22 of LSI chip 20 mounted on and connected to the different circuit board 17. The different circuit board 17 is further provided with another conductor lands 30 and 29 connected to the conductor lands 27 and 28, respectively, on the surface of the different circuit board 17.

In this embodiment, the circuit board 6 has the power conductor 7b and ground conductor 8b as not the inner layers of O-VCC and O-GND layers but conductor pins such as O-VCC pin 19 and O-GND pin 18. The O-VCC and O-GND pins 19 and 18 stand on the fourth and third conductor lands 16 and 15

The O-VCC and O-GND pins 19 and 18 are connected to the conductor lands 30 and 29 in the different circuit board 17. Accordingly, the power and ground terminals 21 and 22 of LSI chip 20 are connected to the power and ground output terminals 5 and 4 of the noise filter 1, without connecting to the VCC layer 7a and GND layer 8a.

Therefore, the DC power applied to the noise filter 1 at power and ground input terminals 2 and 3 is supplied to the LSI chip 20. The noise current of a high frequency generated at the LSI chip 20 also flows into the noise filter 1, reliably, and is attenuated thereat.

In this embodiment, the different circuit board 17 is mounted as a sub-board on the circuit board 6, which is a main board, so that the O-VCC and the O-GND pins 19 and 18 extend upward aside a periphery of the sub-board 17 and are connected to the conductor lands 30 and 29 on the surface of the sub-board 17.

Fourth Embodiment

Figure 6:
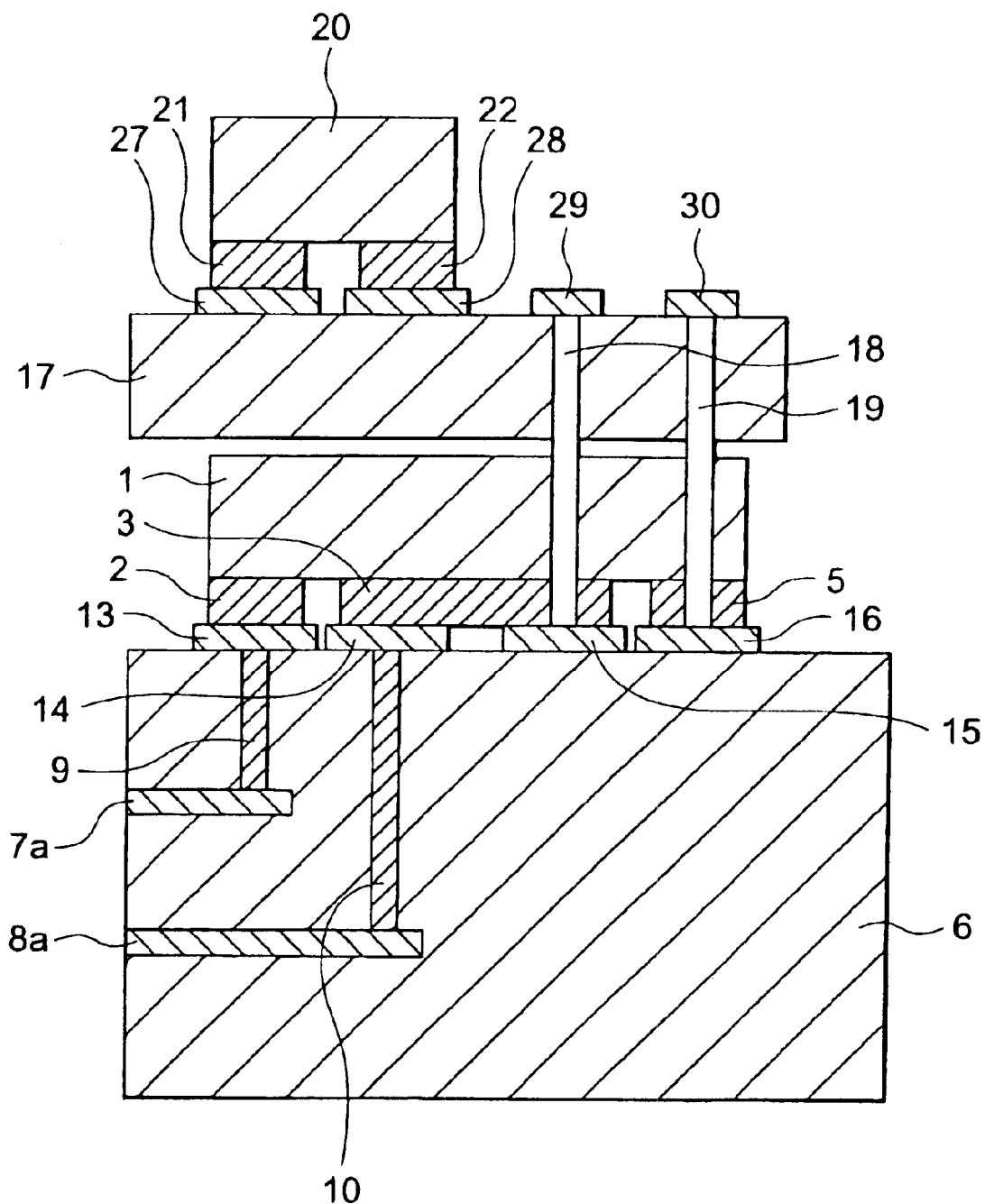
FIG. 6 is a schematic cross sectional view of an electronic device according to a fourth embodiment of the present invention.

Referring to FIG. 6, the fourth embodiment shown therein is similar to the third embodiment except that the ground input and output terminals 3 and 4 in FIG. 5 are joined to form a single ground terminal denoted by reference numeral 3, alone.

In this embodiment, those skilled in the art can understand that the electronic device shown in FIG. 6 according to this embodiment operates in the similar manner to the embodiment shown in FIG. 5.

Fifth Embodiment

Figure 7:
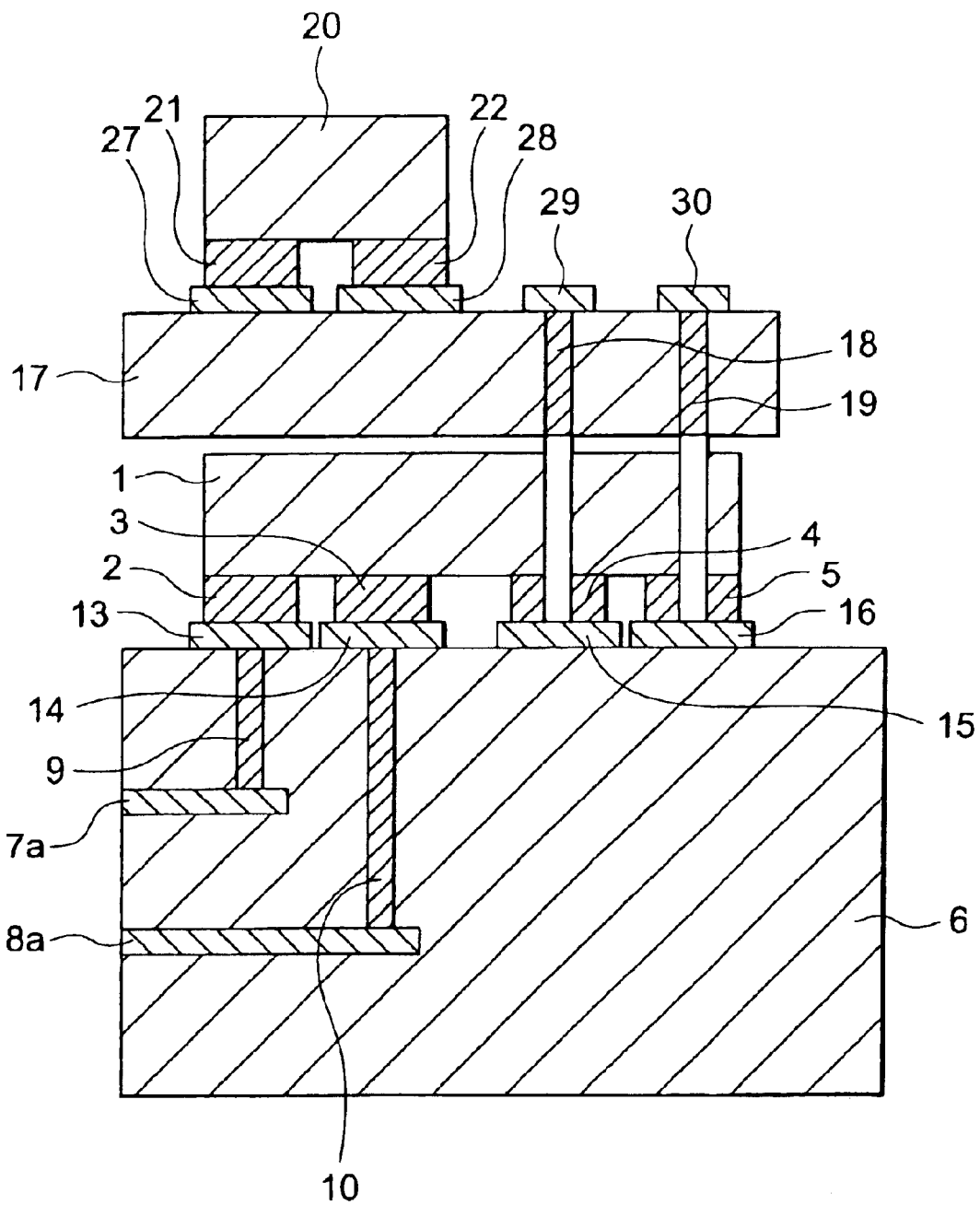
FIG. 7 is a schematic cross sectional view of an electronic device according to a fifth embodiment of the present invention.

Referring to FIG. 7, the fifth embodiment shown therein is similar to the third embodiment except that the O-VCC and O-GND pins 19 and 18 stand upward and penetrate through the sub-bard 17 and are connected to the conductor lands 30 and 29 on the sub-board 17. Therefore, the sub-board 17 is disposed on the main-board 6 so that the conductive lands 29 and 30 are disposed just above the third and fourth conductor lands 15 and 16 on the main-board 6.

In this embodiment, those skilled in the art may understand that the electronic device shown in FIG. 7 according to this embodiment operates in the similar manner to the embodiment shown in FIG. 5.

Sixth Embodiment

Figure 8:
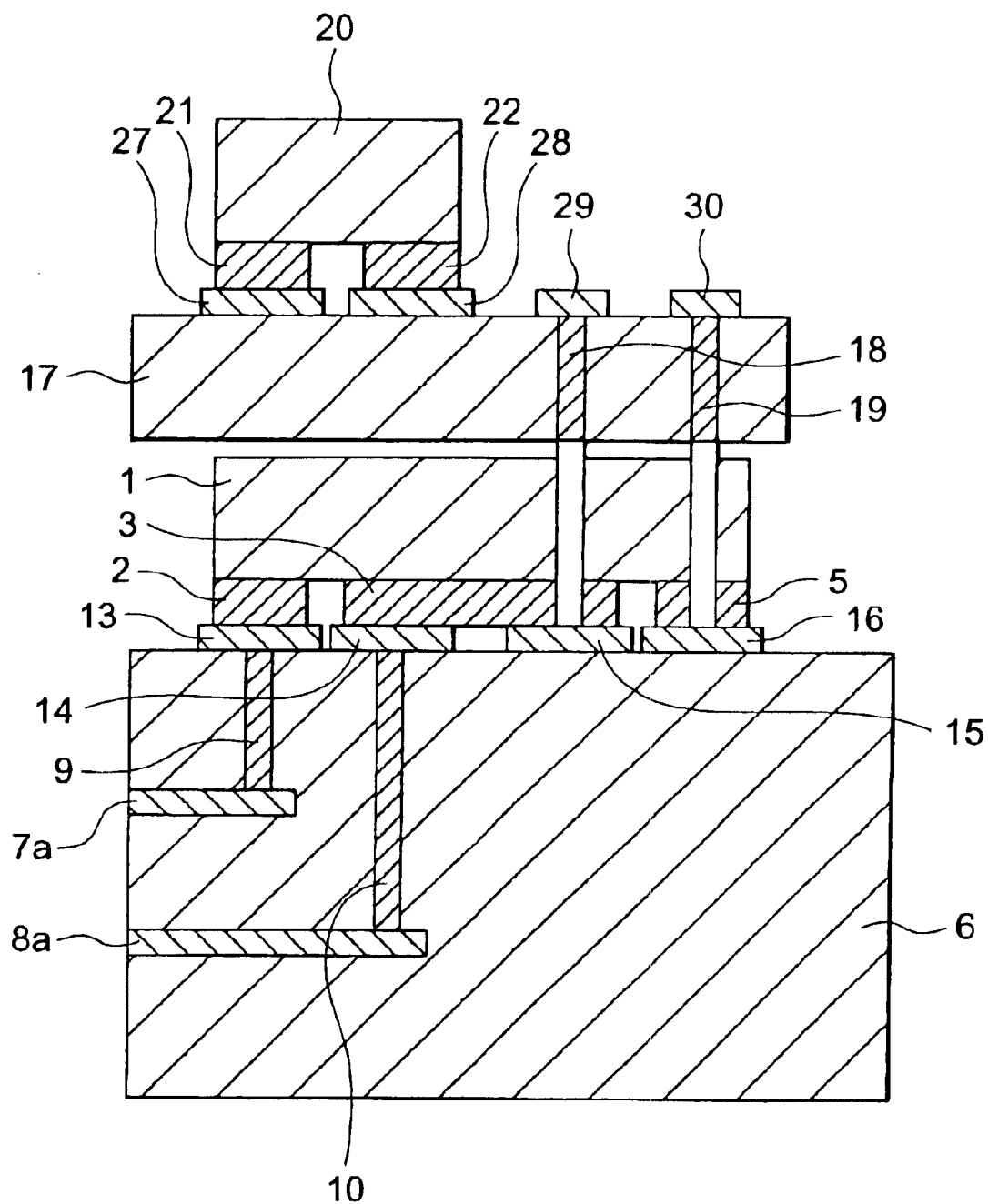
FIG. 8 is a schematic cross sectional view of an electronic device according to a sixth embodiment of the present invention.

Referring to FIG. 8, the sixth embodiment shown therein is similar to the fifth embodiment except that the ground input and output terminals 3 and 4 in FIG. 7 are joined to form a single ground terminal denoted by reference numeral 3, alone.

In this embodiment, those skilled in the art may understand that the electronic device shown in FIG. 8 according to this embodiment operates in the similar manner to the embodiment shown in FIG. 5.

Seventh Embodiment

Figure 9:
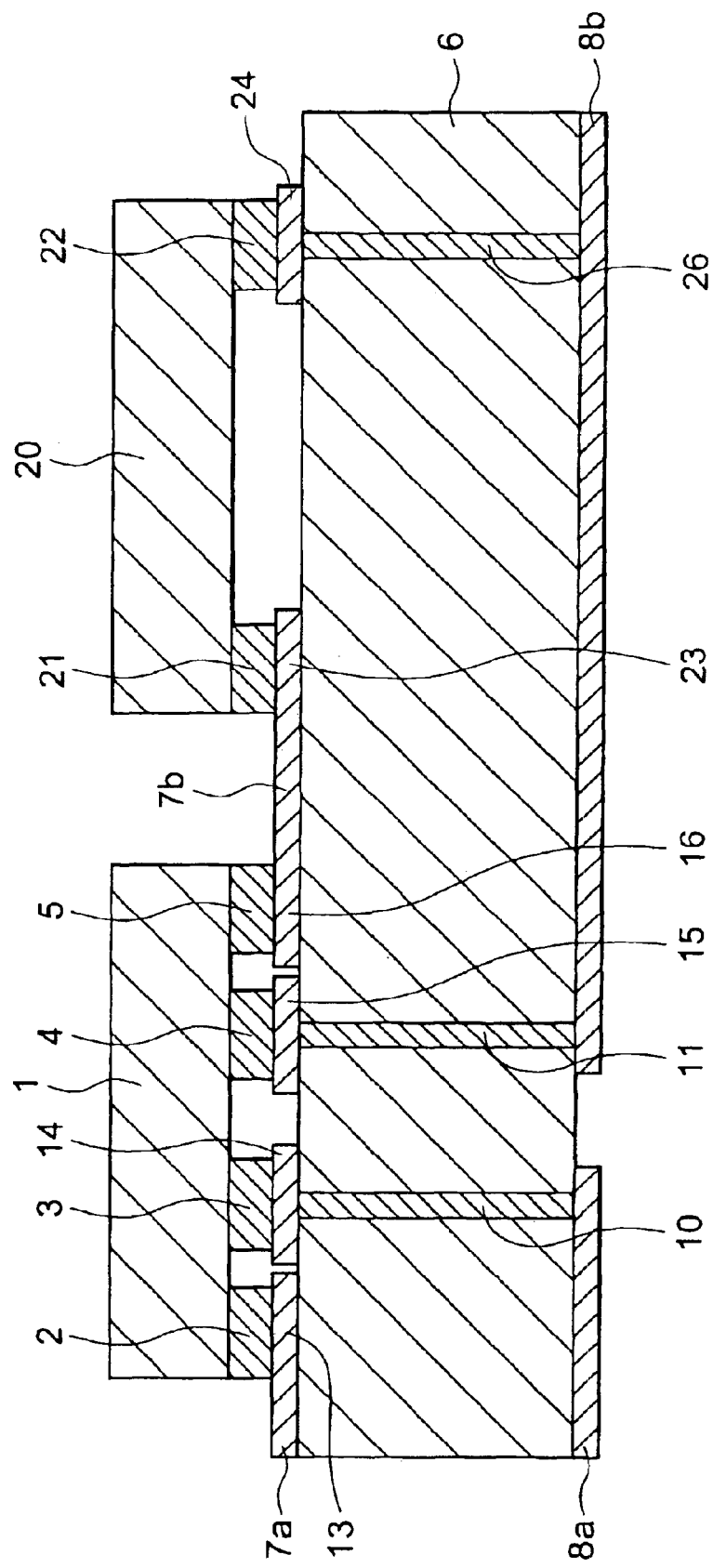
FIG. 9 is a schematic cross sectional view of an electronic device according to a seventh embodiment of the present invention.

Referring to FIG. 9, the electronic device shown therein according to the seventh embodiment is similar to the first embodiment shown in FIG. 3 except that VCC and GND layers 7a and 8a and O-VCC and O-GND layers 7b and 8b are formed as not inner layers but surface layers formed on the opposite surfaces of the circuit board 6.

As shown in the figure, the VCC layer 7a and O-VCC layer 7b are formed on the surface of the circuit board 6. Therefore, the VCC layer 7a is connected to the first conductor land 13 on the surface of the circuit board 6. The O-VCC layer 7b are connected to the fourth conductor land 16 and fifth conductor land 23 on the surface of the circuit board 6.

GND layer 8a and O-GND layer 8b are separately formed on the rear or lower surface of the circuit board 6. The GND layer 8a on the rear surface is connected to the second conductor land 14 on the surface of the circuit board 6 through through-hole 10. The O-GND layer 8b on the rear surface is connected to the third conductor land 15 and sixth conductor land 24 on the surface of the circuit board 6.

In the structure described above, the DC power also is applied to the noise filter 1 at power and ground input terminals 2 and 3 through the VCC and GND layers 7a and 8a as surface layers on the opposite surfaces of the circuit board 6. Then, the DC power is taken out from the noise filter 1 at the power and ground output terminals 5 and 4 onto the O-VCC and O-GND conductors 7b and 8b, which are formed as surface layers on the surface and the rear surface of the circuit board 6, and is then supplied therefrom to the LSI chip 20.

If a noise current of a high frequency is generated at the LSI chip 20 and flows to the O-VCC and O-GND surface layers 7b and 8b, the noise current reliably flows into the noise filter 1 and is attenuated thereat.

Eighth Embodiment

Figure 10:
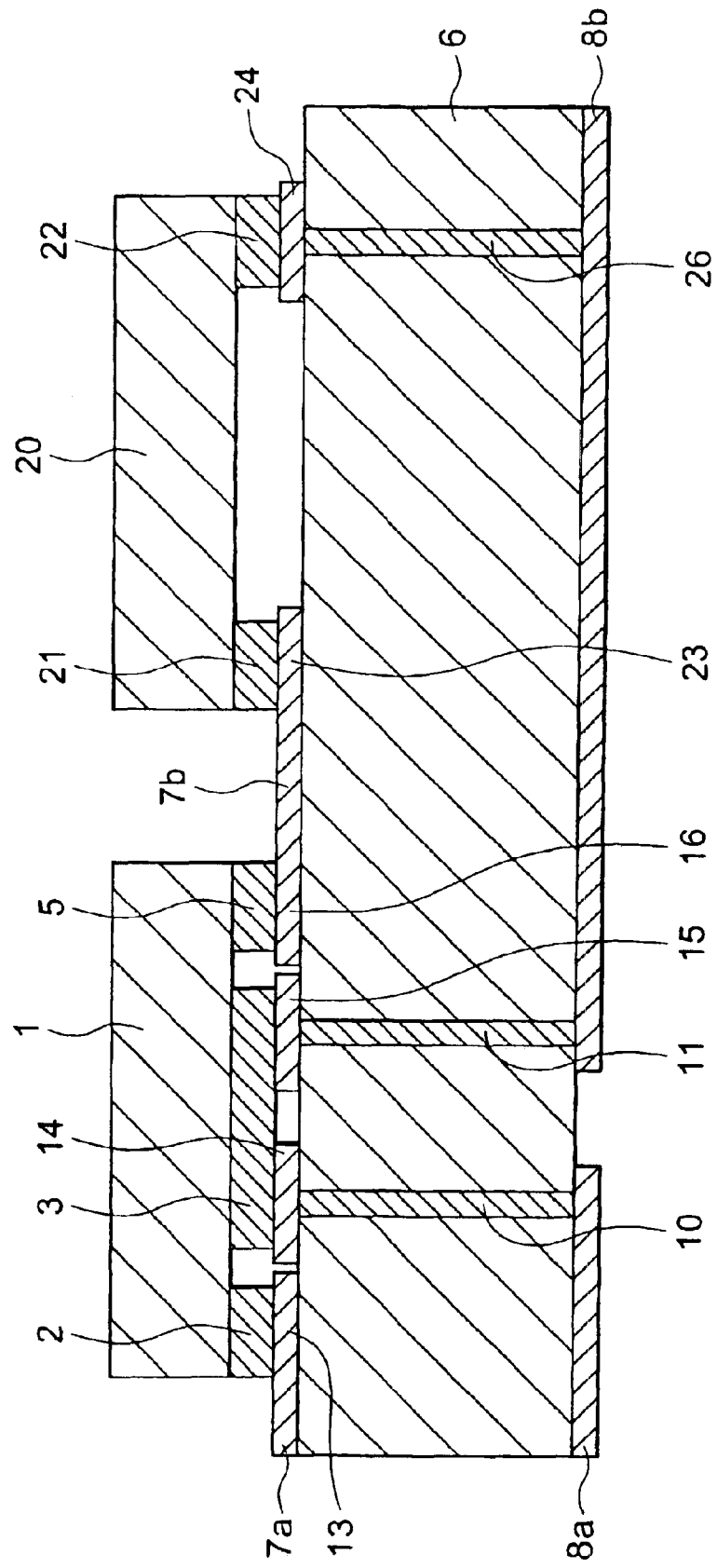
FIG. 10 is a schematic cross sectional view of an electronic device according to an eighth embodiment of the present invention.

Referring to FIG. 10, the electronic device shown therein is similar to that of the seventh embodiment except that the ground input and output terminals 3 and 4 in FIG. 9 are joined to form a single ground terminal denoted by reference numeral 3, alone.

In this embodiment, those skilled in the art may understand that the electronic device shown in FIG. 10 according to this embodiment operates in the similar manner to the embodiment shown in FIG. 9.

Ninth Embodiment

Figure 11:
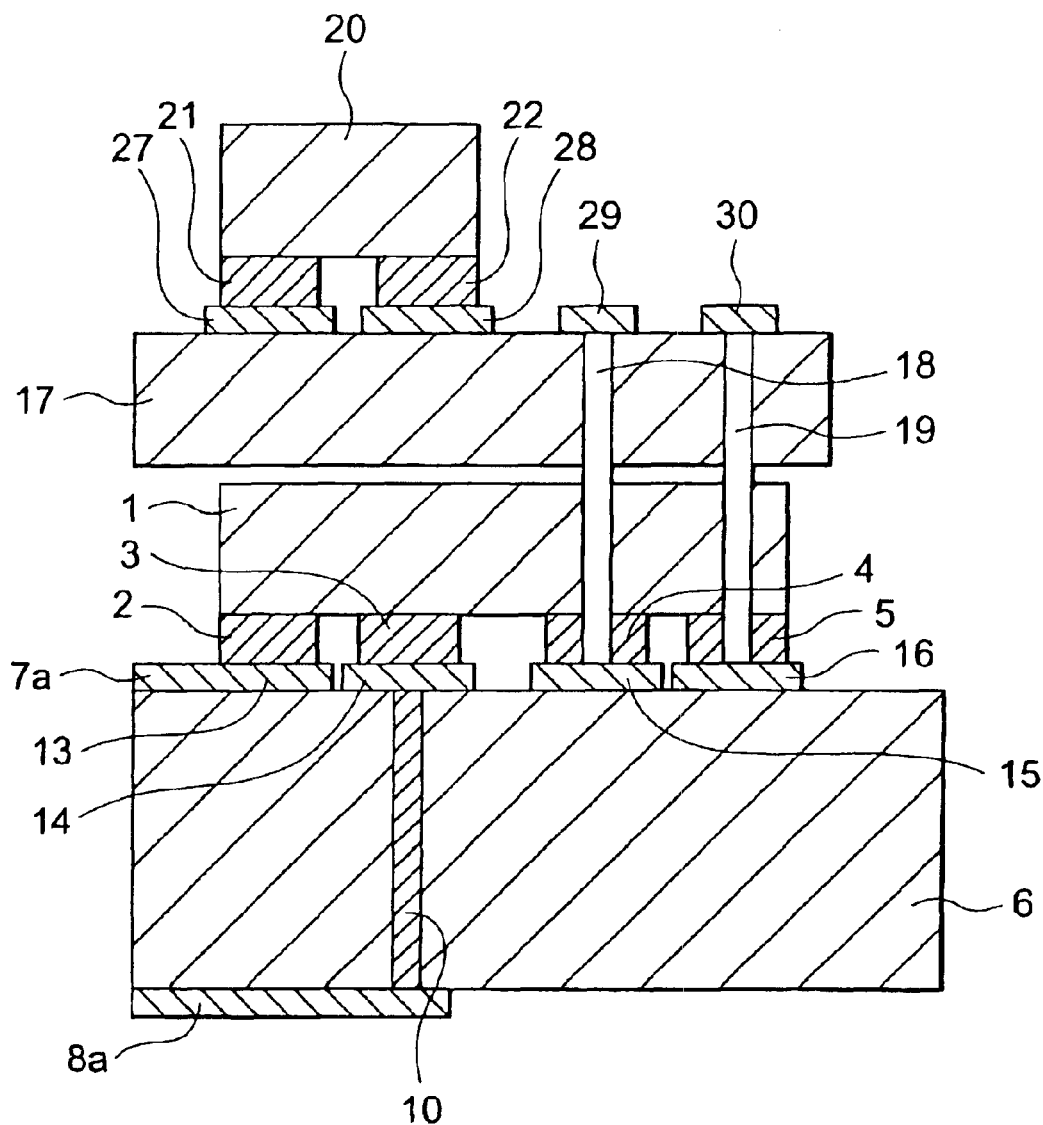
FIG. 11 is a schematic cross sectional view of an electronic device according to a ninth embodiment of the present invention.

Referring to FIG. 11, the electronic device shown therein is a modification of the third embodiment shown in FIG. 5 and is similar thereto except that the VCC and GND layers 7a and 7b are formed as not inner layers but surface layers similar to those in the embodiment of FIG. 10.

In this embodiment, those skilled in the art may understand that the electronic device shown in FIG. 11 according to this embodiment operates in the similar manner to those embodiments shown in FIG. 5 and FIG. 10.

Tenth Embodiment

Figure 12:
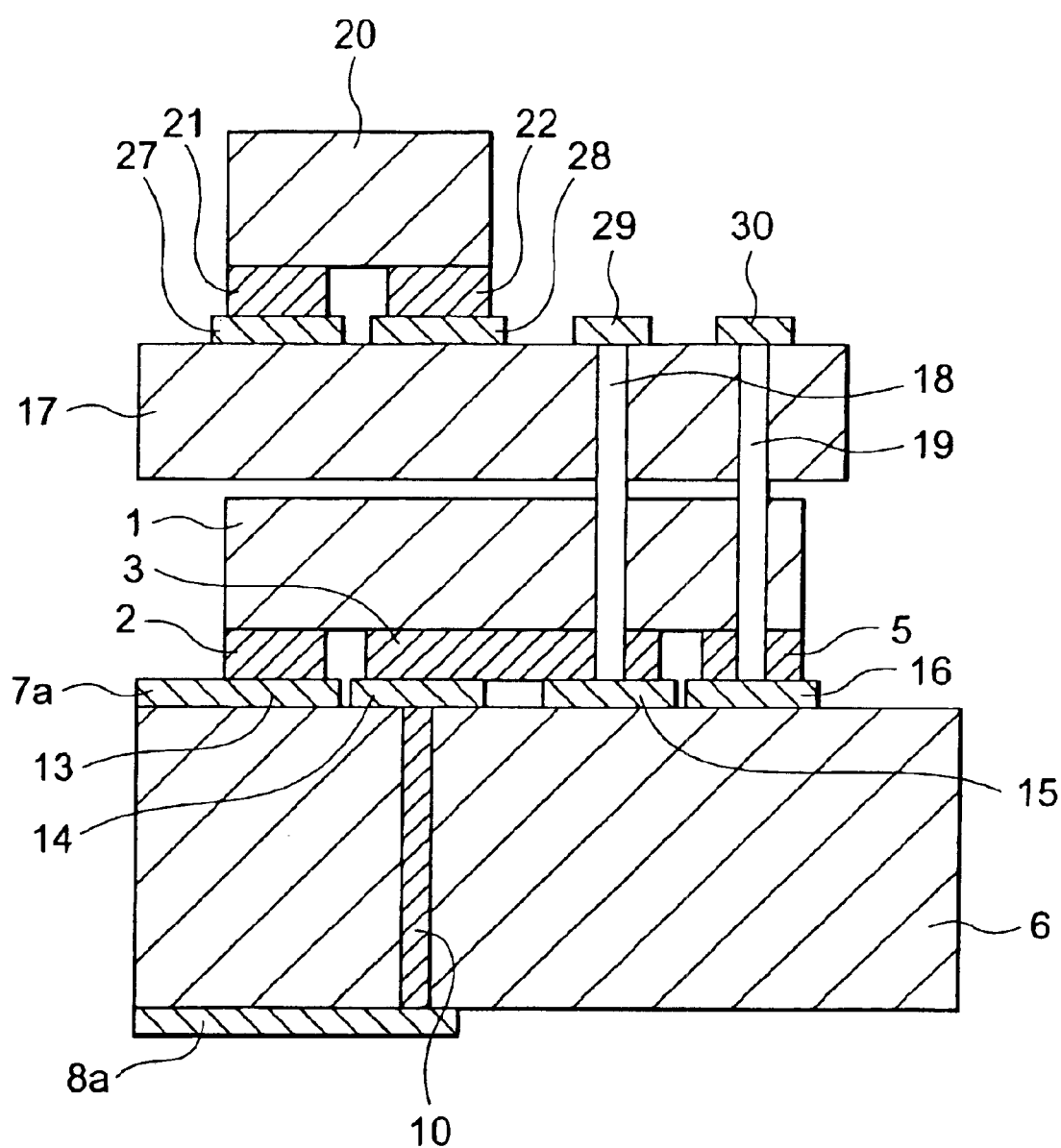
FIG. 12 is a schematic cross sectional view of an electronic device according to a tenth embodiment of the present invention.

Referring to FIG. 12, the electronic device shown therein is similar to that of the ninth embodiment except that the ground input and output terminals 3 and 4 in FIG. 11 are joined to form a single ground terminal denoted by reference numeral 3, alone.

In this embodiment, those skilled in the art may understand that the electronic device shown in FIG. 12 according to this embodiment operates in the similar manner to the embodiment shown in FIG. 11.

Eleventh Embodiment

Figure 13:
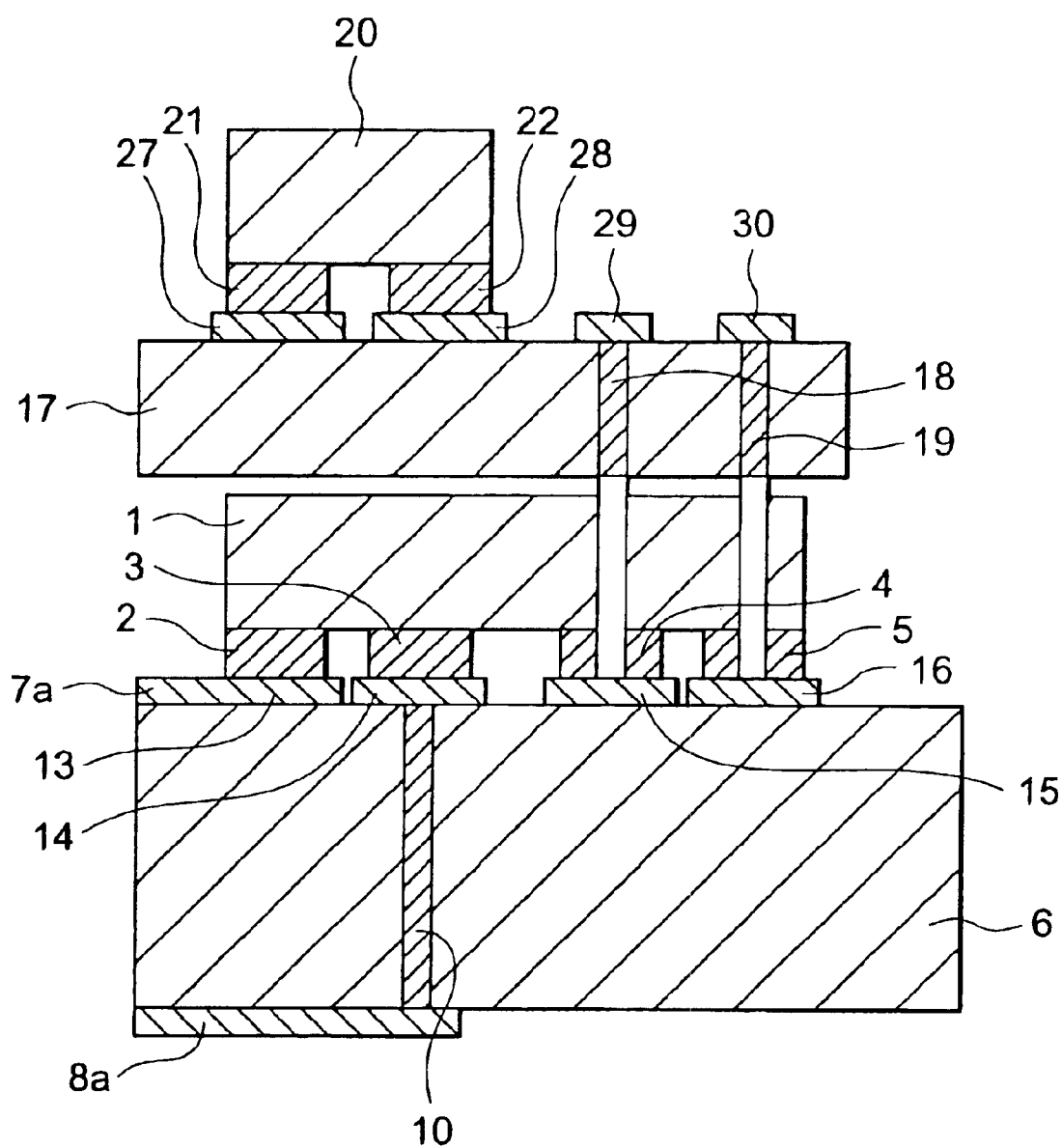
FIG. 13 is a schematic cross sectional view of an electronic device according to an eleventh embodiment of the present invention.

Referring to FIG. 13, the embodiment shown therein is a modification of that in FIG. 11, which modification is similar to that in FIG. 6. That is, the O-VCC and O-GND pins 19 and 18 penetrate through the sub-board 17.

Twelfth Embodiment

Figure 14:
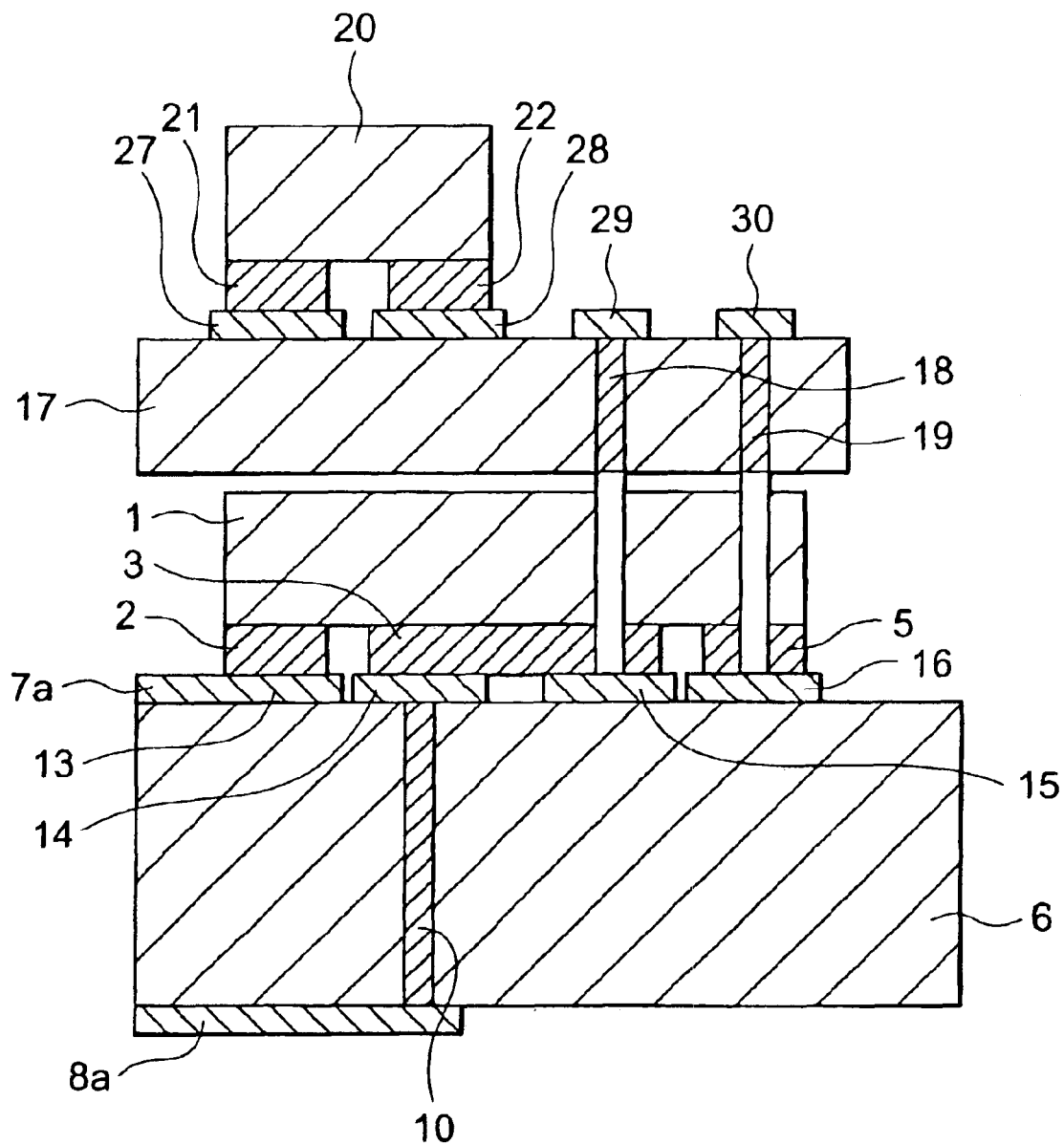
FIG. 14 is a schematic cross sectional view of an electronic device according to a twelfth embodiment of the present invention.

Referring to FIG. 14, the embodiment shown therein also is a modification of the embodiment shown in FIG. 13, in which the ground input and output terminals 3 and 4 in FIG. 13 are joined to form a single ground terminal denoted by reference numeral 3, alone.

In eleventh and twelfth embodiments, those skilled in the art may understand that the electronic devices shown in FIGS. 13 and 14 operate in the similar manner to the embodiment shown in FIG. 11.

Now, an example of the noise filter 1 used in the embodiments will be described referring to FIG. 15.

Figure 15:
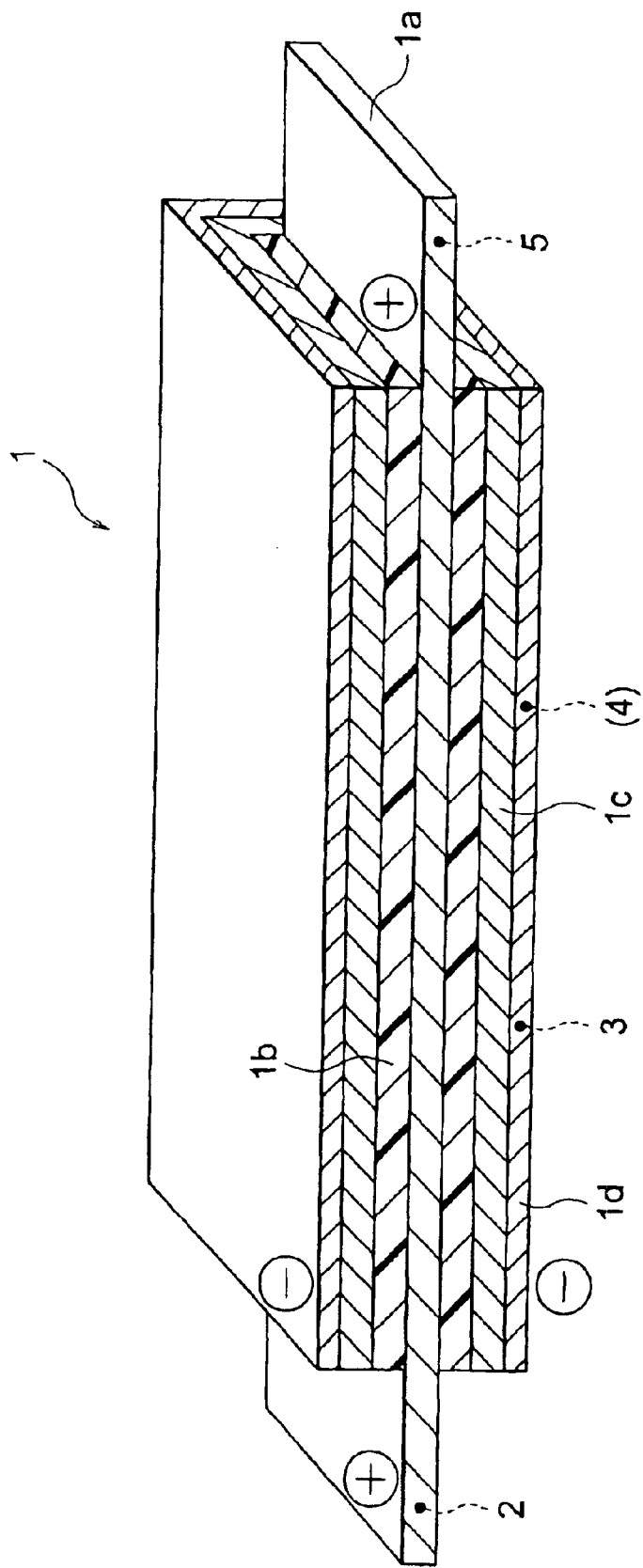
FIG. 15 is a perspective view of a noise filter used in FIGS. 2–14, showing a structure of the filter element.

The noise filter 1 shown in FIG. 15 is a distributed-constant type and is structured as two-port distributed-constant capacitor of a 3-terminal or a 4-terminal type. The noise filter 1 has a capacitor formed in the form of a transmission line called as a "strip line". The capacitor comprises a flat metal plate or strip 1a sandwiched, except opposite end potions, between opposing dielectric members 1b, which are further sandwiched between opposing oxide layers 1c folded. Then, a graphite/silver paste layer 1d is coated on the oxide layers 1c and cured to form a distributed-constant type capacitor element. Opposite end portions of the flat metal plate 1a are exposed out of the superposed layers 1b–1c–1d. The capacitor element is molded in a plastic resin as an outer housing to obtain a noise filter as a chip type. The outer housing has input and output terminals 2 and 5 and ground terminals 3 and 4. The input and output terminals 2 and 5 are connected to the opposite end portions of the metal strip 1a, and the ground terminals 3 and 4 are connected to the graphite/silver layer 1d, prior to molding. Thus, the 4-terminal noise filter 1 shown in FIG. 3 is obtained. A single ground terminal 3 in place of two ground terminals 3 and 4 may be formed to obtain the 3-terminal noise filter 1 shown in FIG. 4.

Figure 16:
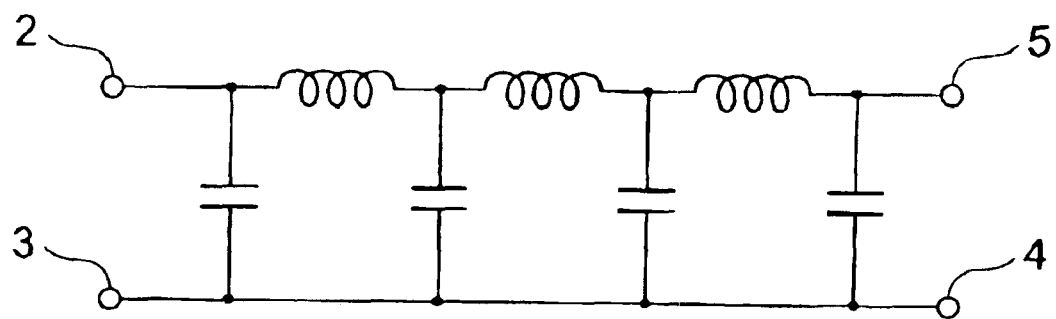
FIG. 16 is an equivalent circuit of the noise filter in FIG. 15, in four-terminal type.
Figure 17:
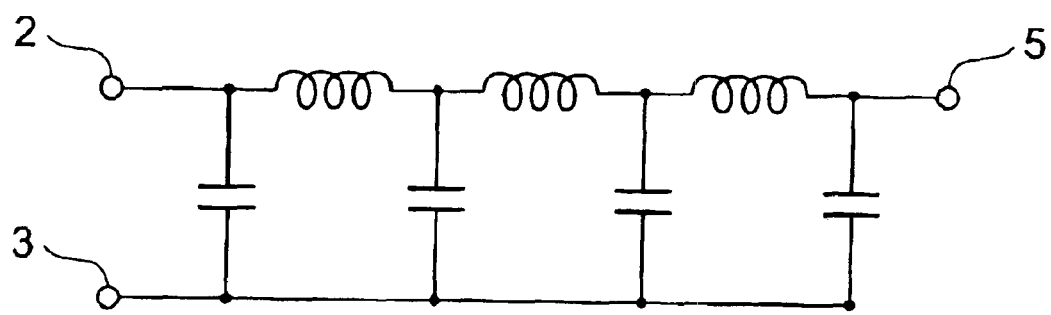
FIG. 17 is another equivalent circuit of the noise filter in FIG. 15, in three-terminal type.

The distributed constant type noise filter 1 as mentioned above is represented by equivalent circuits shown in FIGS. 16 and 17 for a high frequency. The circuits in FIGS. 16 and 17 are corresponding to the 4-terminal structure and 3-terminal structure, respectively. In either case, the noise filter comprises L and C components to form a two-port filter circuit having one port 2-3 and the other port 5-4 or 5-3.

It may be understood by those skilled in the art that if a high frequency signal or noise current is inputted thereto, the noise current is attenuated by the filter and is not outputted to the other one of the two ports.

Further, it may also be understood that the input and output terminals 2 and 5 are directly connected for DC current. The ground terminals 3 and 4 are also connected to each other for DC current. Accordingly, by connecting the input port 2-3 and output port 5-4 (or 5-3) to a DC power source and load circuit, respectively, the DC power can be supplied to the load circuit through the noise filter 1 and the high frequency noise current from the load circuit can be attenuated at the noise filter.

The noise filter is proposed in the prior Japanese Patent Application No. 2001-259453 which is described hereinbefore. Accordingly, the further detailed description will be omitted but will be noted with reference to the specification and drawing of the prior patent application. Therefore, the specification and drawings of the prior patent application are incorporated to the present application.

The noise filter 1 used in the present invention is not restricted to those disclosed in the prior patent application, but any other two-port noise filters, which can attenuate a high frequency noise current inputted thereto from either one of the two ports and can transport DC power from one port to the other port.

Figure 18:
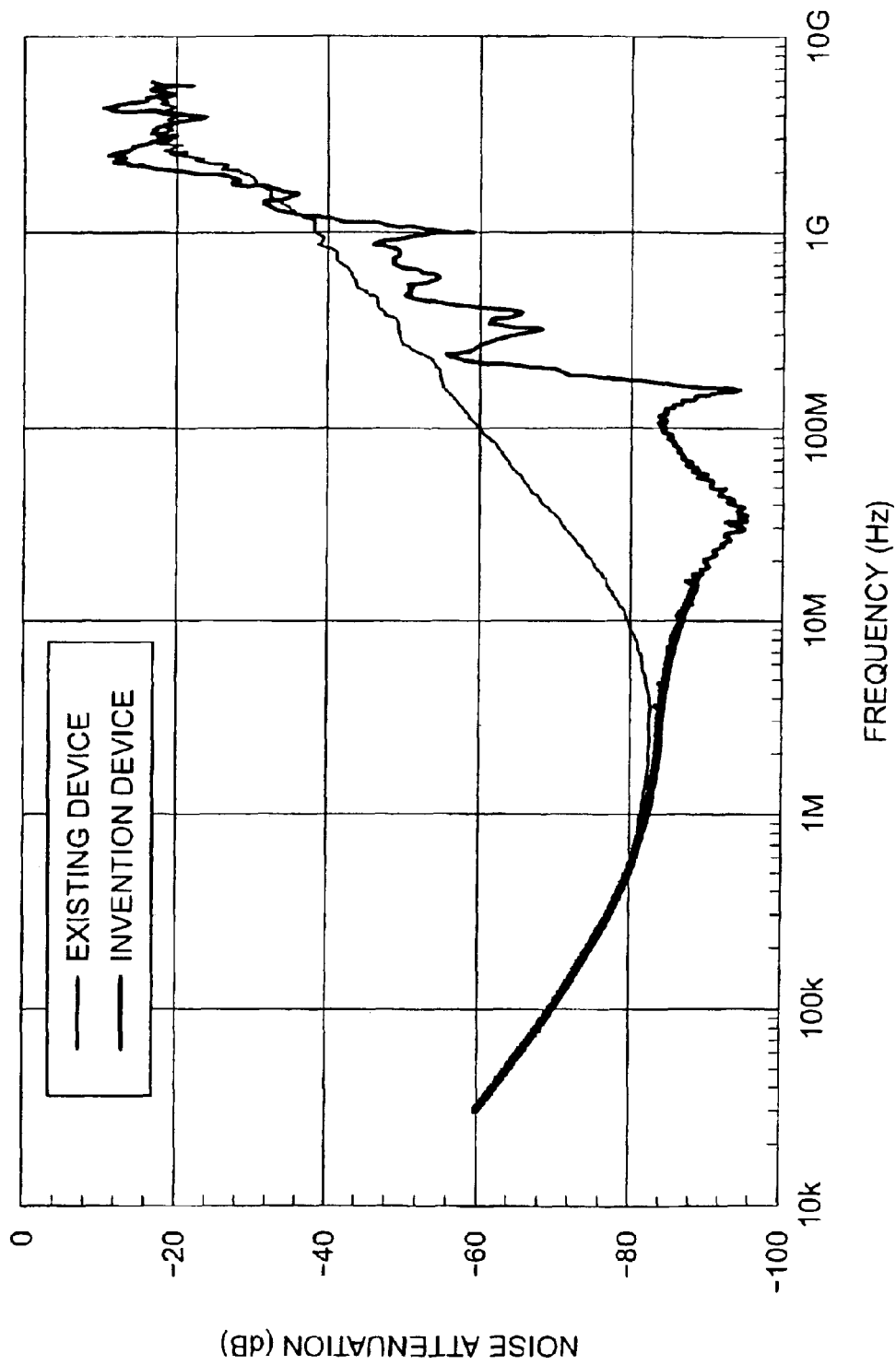
FIG. 18 is a graph showing a noise attenuation frequency response of the embodiment of FIG. 3 in comparison with that of FIG. 1.

FIG. 18 shows a noise attenuation frequency response of the electronic device according to the first embodiment shown in FIG. 3. The thick curve line shows the response. In comparison with this, a thin curve line shows a frequency response of the noise attenuation by the existing device shown in FIG. 1.

It will be seen form FIG. 18 that the electric device of the present invention is excellent in noise reduction over a wide frequency extent comparing the existing device. In particular, the electronic device of the present invention is remarkably excellent in the noise reduction over a frequency range not less than approximate 10 MHz.

While this invention has thus far been described in conjunction with preferred embodiments, it will now be readily possible for those skilled in the art to put this invention into practice in various other manners.

What is claimed is:

1. An electronic device for supplying a DC power to a load circuit from a power source and isolating in a high frequency a power line circuit including the power source from the load circuit generating a high frequency noise, which comprises:
    a circuit board (6) comprising first through fourth conductor lands (13, 14, 16, 15) formed on a surface of said circuit board, a power line conductor layer (7a) connected to said first conductor land (13), and a ground conductor layer (8a) connected to said second conductor land (14), said power line conductor layer (7a) being adapted to be connected to the power source, said ground conductor layer (8a) being adapted to be grounded;
    a noise filter (1) mounted on said circuit board (6) and having a power input terminal (2), a ground input terminal (3), a ground output terminal (4), and a power output terminal (5), which are connected to said first through said fourth conductor lands (13, 14, 15, 16), respectively, said noise filter having a high frequency filtering circuit for reducing the high frequency noise incoming thereto but allowing a DC current to pass therethrough; and
    power and ground conductors (7b, 8b, 19, 18) connected to said fourth and said third conductor lands (16, 15) for connecting said fourth and said third conductor lands (16, 15) with the load circuit without connecting to said power line conductor layer (7a) and said ground conductor layer (8a).

2. An electronic device according to claim 1, wherein said ground input terminal (3) and said ground output terminal (4) are joined to each other to form a single ground terminal (3).

3. An electronic device according to claim 1, wherein said power line conductor layer (7a) is formed, as an inner layer, in said circuit board (6), and said power line conductor layer (7a) is connected to said first conductor land (13) through a first through-hole (9) formed in said circuit board (6).

4. An electronic device according to claim 1, wherein said ground conductor layer (8a) is formed, as an inner layer, in said circuit board (6), and said ground conductor layer (8a) is connected to said second conductor land (14) through a second through-hole (10) formed in said circuit board (6).

5. An electronic device according to claim 1, wherein said power line conductor layer (7a) is formed on said surface of said circuit board (6) and connected to the first conductor land.

6. An electronic device according to claim 1, wherein said ground conductor layer (8a) is formed on a rear surface of said circuit board (6), said ground conductor layer (8a) being connected to said second conductor land (14) through a third through-hole (10) formed in the circuit board.

7. An electronic device according to claim 1, wherein said power conductor is formed, as an inner layer (7b), in said circuit board (6), and said power conductor (7b) is connected to said fourth conductor land (16) through a fourth through-hole (12) formed in said circuit board (6).

8. An electronic device according to claim 1, wherein said ground conductor (8b) is formed, as an inner layer, in said circuit board (6), and said ground conductor (8b) is connected to said third conductor land (15) through a fifth through-hole (11) formed in said circuit board (6).

9. An electronic device according to claim 1, wherein said power conductor layer (7b) is formed on said surface of said circuit board (6) and connected on the fourth conductor land on the circuit board.

10. An electronic device according to claim 1, wherein said ground conductor (8b) is formed on a rear surface of said circuit board (6) and is connected to said third conductor land (15) through a sixth through-hole (11) formed in said circuit board (6).

11. An electronic device according to claim 1, wherein the load circuit (20) is mounted on said surface of said circuit board (6) and is connected to said power conductor (7b) and said ground conductor (8b).

12. An electronic device according to claim 1, the load circuit (20) being mounted on a different circuit board (17) separate from said circuit board (6), wherein said power and said ground conductors include a power conductor pin (19) and a ground conductor pin (18) connected to said fourth and said third conductor lands (16, 15) on said circuit board (6) for connecting said fourth and said third conductor lands (16, 15) with said different circuit board (17) to establish an electrical connection of said fourth and said third conductor lands (16, 15) to said load circuit (20).

13. An electronic device according to claim 12, said load circuit (20) being surface-mounted on said different circuit board (17), wherein said power and said ground conductor pins (18, 19) penetrate in said different circuit board (17) from a rear surface to said surface thereof.

14. An electronic device according to claim 1, wherein said noise filter (1) is a distributed constant type.

* * * * *